United States Patent
Lee et al.

(10) Patent No.: US 7,317,245 B1
(45) Date of Patent: Jan. 8, 2008

(54) METHOD FOR MANUFACTURING A SEMICONDUCTOR DEVICE SUBSTRATE

(75) Inventors: Kyu Won Lee, Seoul (KR); Chan Yok Park, Seoul (KR); Sang Hyun Ryu, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 102 days.

(21) Appl. No.: 11/279,002

(22) Filed: Apr. 7, 2006

(51) Int. Cl.
*H01L 23/48* (2006.01)
*H01L 23/52* (2006.01)

(52) U.S. Cl. .................. 257/690; 257/693; 257/70; 257/737; 257/738

(58) Field of Classification Search ............... None
See application file for complete search history.

(56) References Cited

U.S. PATENT DOCUMENTS

2005/0266608 A1* 12/2005 Ho et al. ............... 438/106
2006/0017151 A1* 1/2006 Yoon et al. .............. 257/700
2006/0145343 A1* 7/2006 Lee et al. ................ 257/737
2006/0145345 A1* 7/2006 Choi et al. .............. 257/738
2007/0010064 A1* 1/2007 Das et al. ................ 438/393

* cited by examiner

*Primary Examiner*—Duy-Vu N Deo
(74) *Attorney, Agent, or Firm*—Weiss & Moy, P.C.

(57) ABSTRACT

Disclosed is a method for manufacturing a semiconductor device substrate. A substrate having no bus line and lead-in line is efficiently manufactured. In a step needing an electroplating process, conductive film is temporarily attached to circuit patterns in order to electrically connect all circuit patterns. A plating is formed in desired regions of the circuit patterns with a predetermined thickness in an electroplating method. The conductive film is completely removed while the substrate is manufactured so that the circuit patterns are electrically independent of one another, and the resulting substrate has no bus line and lead-in line.

20 Claims, 14 Drawing Sheets

METHOD FOR MANUFACTURING A SEMICONDUCTOR DEVICE SUBSTRATE

FIELD OF THE INVENTION

The present invention relates to a semiconductor devices and, more specifically, to a method for manufacturing a semiconductor device substrate.

BACKGROUND OF THE INVENTION

In general, a method for manufacturing a substrate, to which a semiconductor die, solder balls, and the like are electrically connected, includes an insulation layer provision step of providing an insulation layer having metallic foil formed on both surfaces thereof. A number of holes are formed on both surfaces of the insulation layer. A primary plating step is done by forming an electroless plating and an electrolytic plating on the inner wall of the holes and on the surface of the metallic foil so that the metallic foil on both surfaces of the insulation layer is electrically connected to each other via the holes. A patterning step is performed by attaching dry film to the platings and forming actual circuit patterns through exposure/development/etching processes. A solder mask is formed by printing a solder mask and exposing a region, to which a semiconductor die, solder balls, and the like are to be actually connected, while covering remaining regions, through exposure/development processes. A secondary plating step is done by forming nickel/gold platings in a predetermined region of the circuit patterns exposed by the solder mask.

In the case of a conventional substrate, a bus line is formed on the outer periphery of the substrate in the patterning step in such a manner that the bus line is thicker or larger than the circuit patterns. In addition, a number of lead-in lines are formed on the bus line to connect all circuit patterns to one another. Such formation of the bus line and lead-in lines is for the purpose of forming nickel/gold platings in a predetermined region of the circuit patterns, which has been exposed by the solder mask in the second plating step, with a sufficient thickness in an electrolytic plating method. Without the bus line and lead-in lines, the nickel/gold platings cannot be formed in an electrolytic plating method, but in an electroless plating method. If the electroless plating method is used, it is difficult to obtain sufficient reliability at a package level in terms of wire bonding and solder weldability. The bus line is removed through a sewing process after the nickel/gold platings are formed, and all circuit patterns are electrically independent in the end. However, the lead-in lines remain connected to the circuit patterns and cause a number of problems when designing a substrate or operating a semiconductor device.

First, formation of lead-in lines from all circuit patterns towards the outer periphery of the substrate decreases the density of the circuit patterns. Particularly, lead-in lines are formed in positions, where circuit patterns are supposed to be formed, and fewer circuit patterns are allowed to be formed. In addition, the lead-in lines decrease the degree of freedom in designing the circuit patterns and render the design of circuit patterns very difficult.

Second, a large number of lead-in lines left on the insulation layer, even after the substrate is manufactured, reflect and delay electric signals flowing through the circuit patterns. As such, the lead-in lines substantially degrade the electrical performance of the semiconductor device.

Third, a large number of lead-in lines exposed to the outside via the edge of the substrate are likely to contact an external conductor while the semiconductor device is transported or handled. Particularly, the lead-in lines may cause static electricity to flow into the semiconductor device or generate an unnecessary short circuit. This may damage the semiconductor device.

In order to solve these problems, a substrate having no bus line and lead-in line has been developed and studied. However, conventional methods for manufacturing a substrate without bus line and lead-line have a problem in that, in order to form nickel/gold platings, separate processes for dry film attachment, exposure, and etching must be performed a number of times. Particularly, the dry film process, which must be repeated a number of times to form nickel/gold platings, increases the manufacturing cost of the substrate and decreases the yield rate thereof.

Therefore, a need existed to provide a device and method to overcome the above problem.

BRIEF SUMMARY OF THE INVENTION

A method for manufacturing a semiconductor device substrate is disclosed. The method comprises providing an insulation layer. Circuit patterns are formed on the first and second surfaces of the insulation layer. A solder mask is formed on the first and second surfaces while exposing predetermined regions of the circuit patterns. A first conductive film is coupled to the first surface to electrically couple the circuit patterns formed on the first and second surfaces. A first plating is formed on the circuit patterns formed on the second surface and exposed. The first conductive film is then removed. A second conductive film is coupled to the second surface to electrically connect all circuit patterns formed on the first and second surfaces. A second plating is formed on the circuit patterns formed on the first surface and exposed to the outside.

The present invention will be more apparent from the following detailed description taken in conjunction with the accompanying drawings.

BRIEF DESCRIPTION OF THE DRAWINGS

FIG. 1A shows a hole formation step;
FIG. 1B shows a basic plating formation step;
FIG. 1C shows a patterning step;
FIG. 1D is a top view showing an example of a substrate after patterning;
FIG. 1E shows a solder mask printing step;
FIG. 1F shows an exposure step;
FIG. 1G shows a development step;
FIG. 1H shows a primary conductive film attachment step;
FIG. 1I shows a primary plating formation step;
FIG. 1J shows a secondary conductive film attachment step;
FIG. 1K shows a secondary plating formation step;
FIG. 1L is a sectional view showing a finished substrate after removing the secondary conductive film;

FIG. 2A shows a hole formation step;
FIG. 2B shows a basic plating formation step;
FIG. 2C shows a patterning step;

FIG. 2D is a top view showing an example of a substrate after patterning;

FIG. 2E shows a conductive film attachment step;

FIG. 2F shows a conductive film exposure/development step;

FIG. 2G shows a plating formation step;

FIG. 2H shows a conductive film removal step;

FIG. 2I shows a solder mask printing step;

FIG. 2J shows a solder mask exposure step; and

FIG. 2K is a sectional view showing a finished substrate after solder mask development.

Common reference numerals are used throughout the drawings and the detailed description to indicate the same elements.

DETAILED DESCRIPTION OF THE INVENTION

Referring to FIGS. 1A to 1L, a series of steps of a method for manufacturing a semiconductor device substrate according to an embodiment of the present invention are illustrated.

Figure 1A:
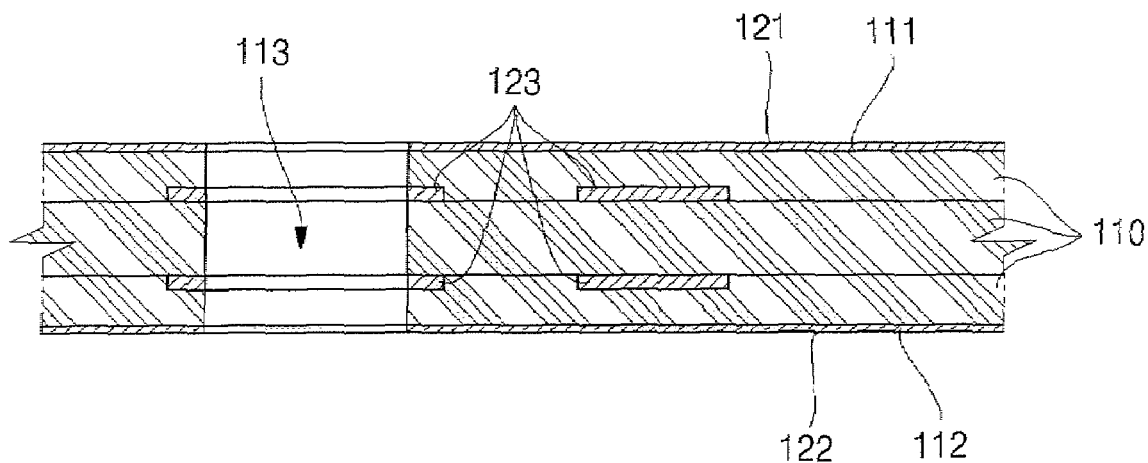
FIGS. 1A to 1L show a series of steps of a method for manufacturing a semiconductor device substrate according to an embodiment of the present invention, particularly.
Figure 1B:
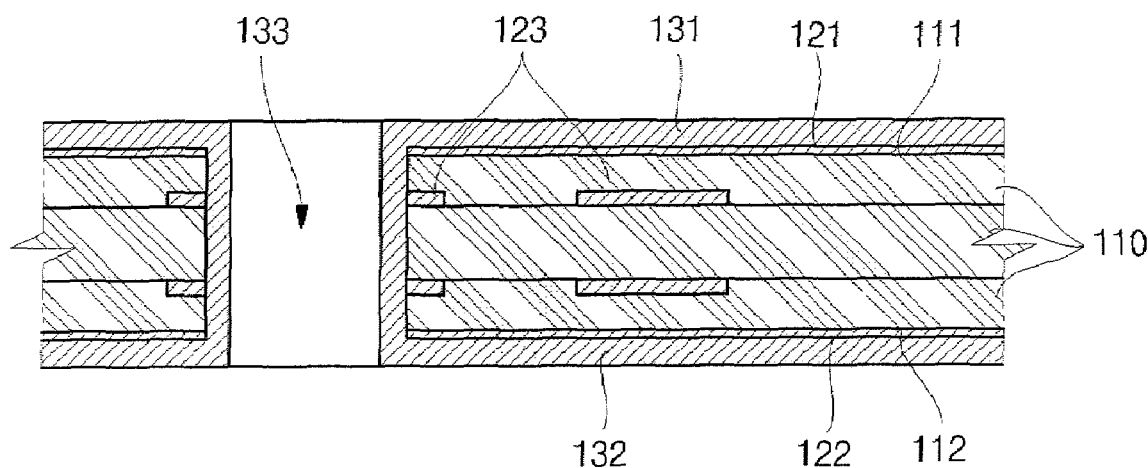
Figure 1C:
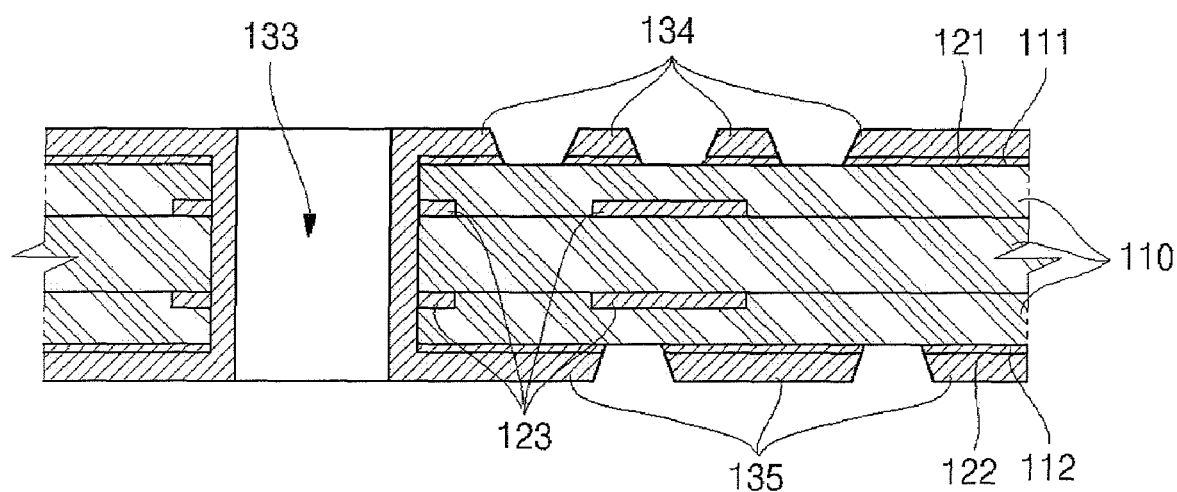
Figure 1D:
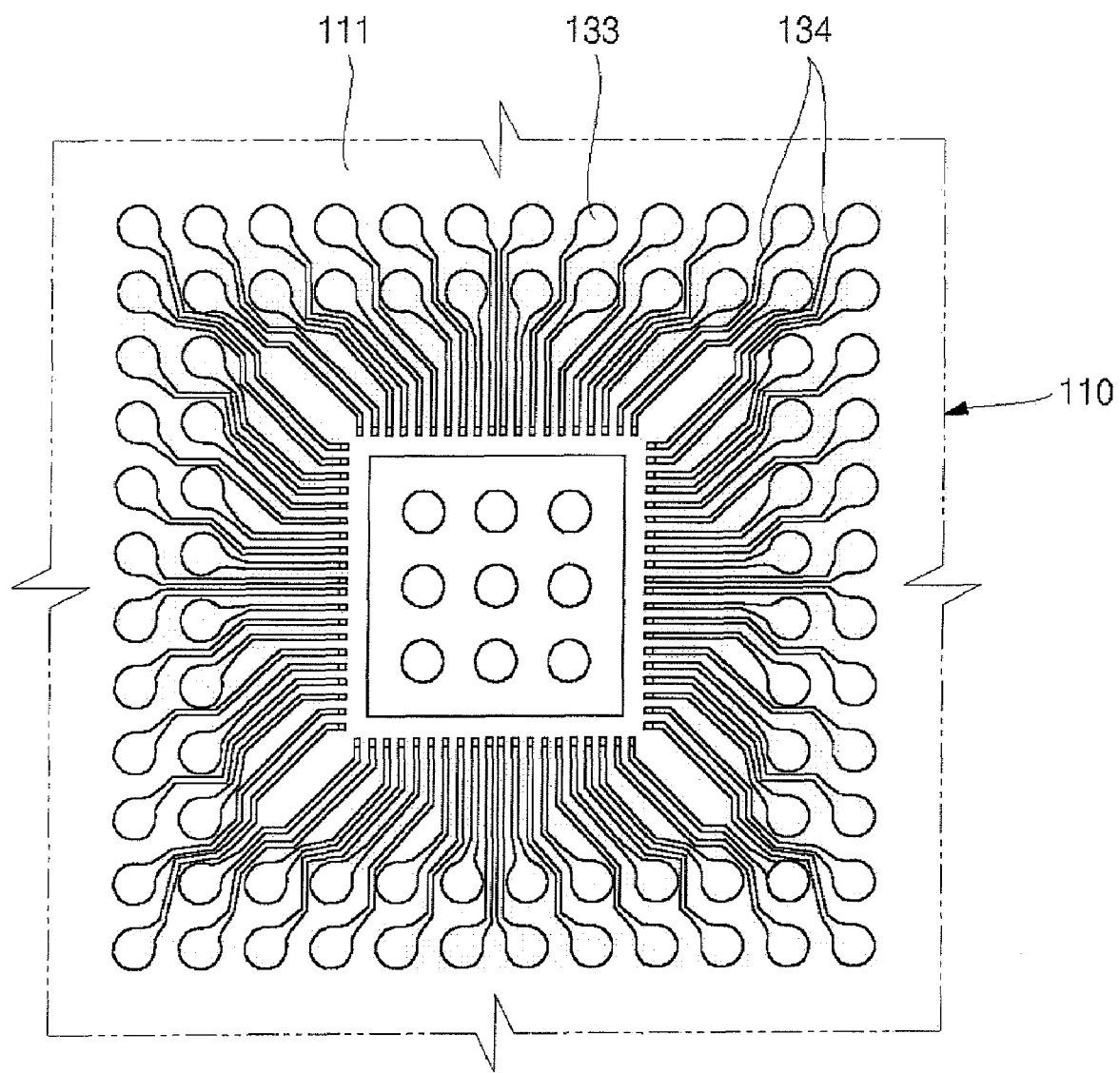
Figure 1E:
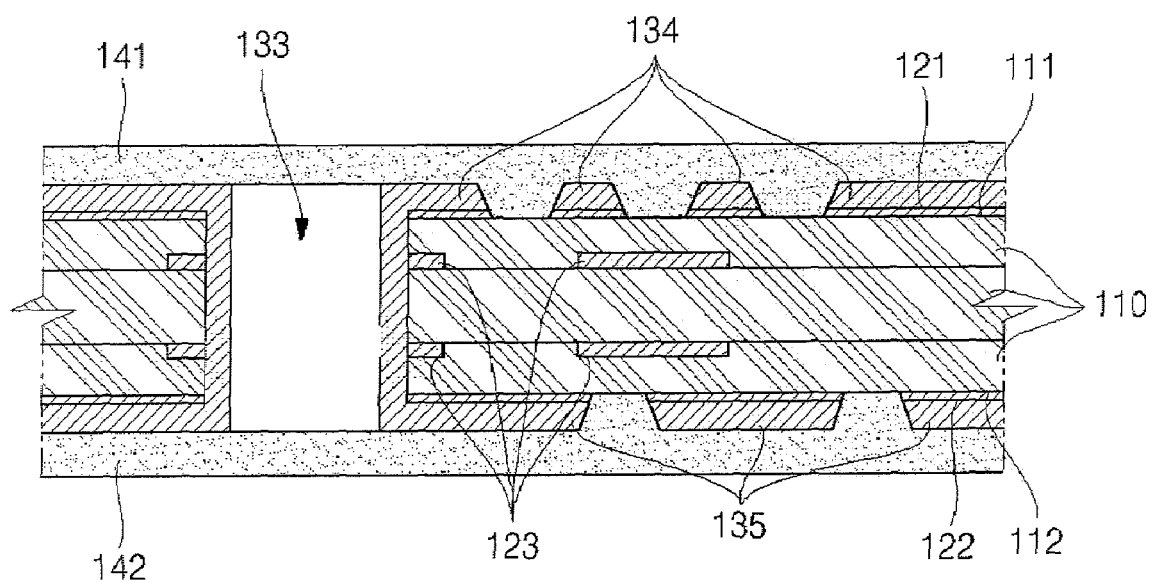
Figure 1F:
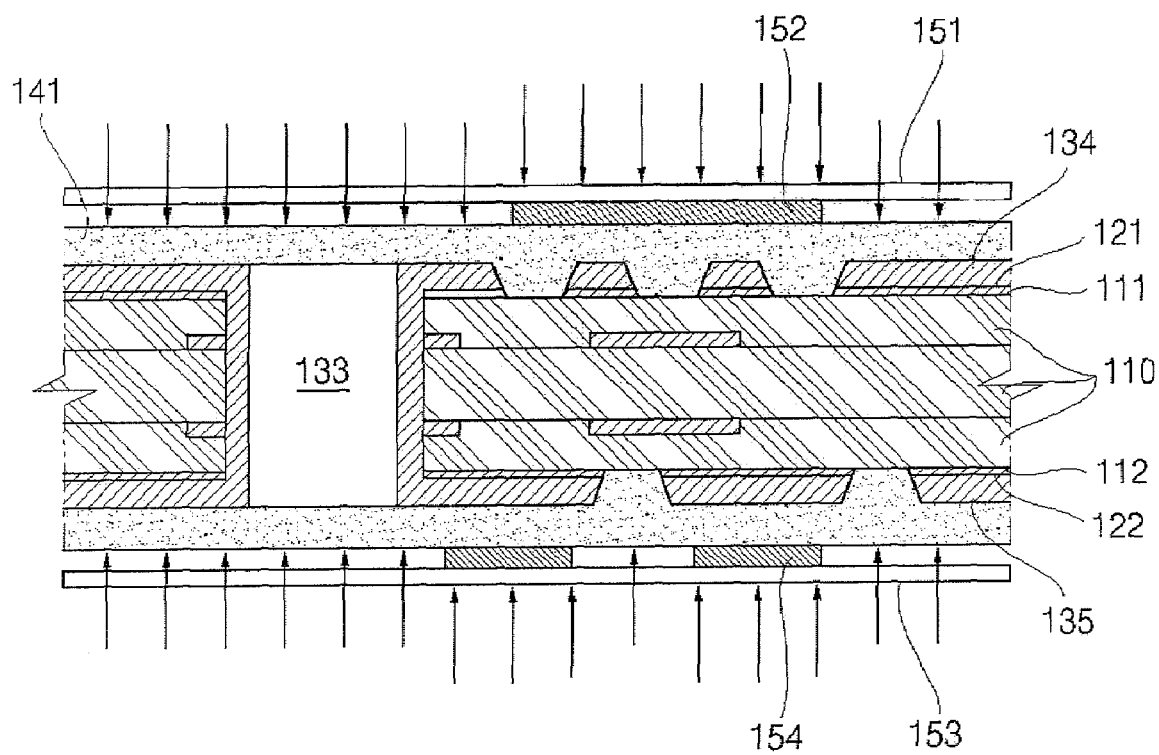
Figure 1G:
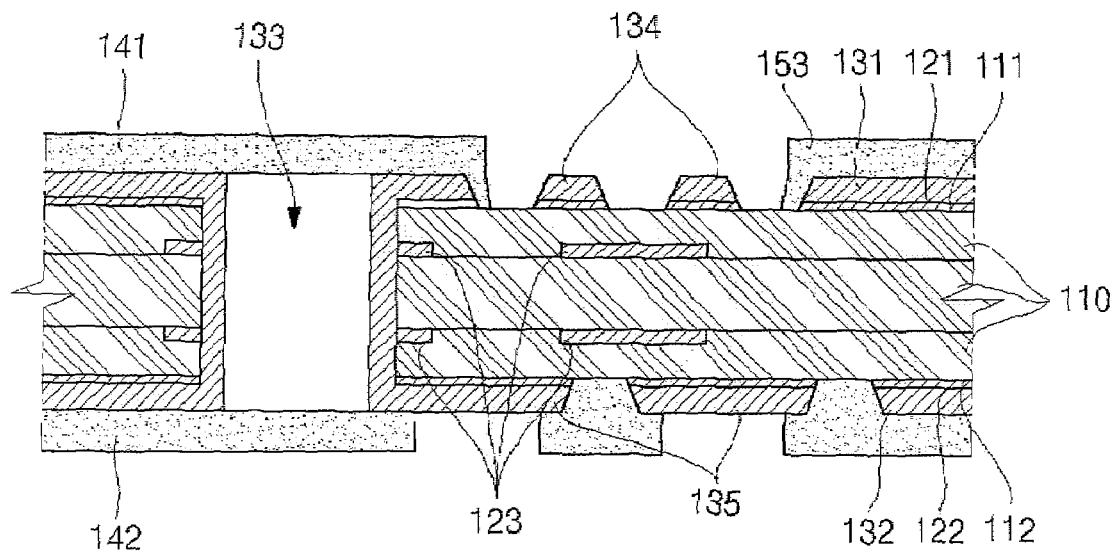
Figure 1H:
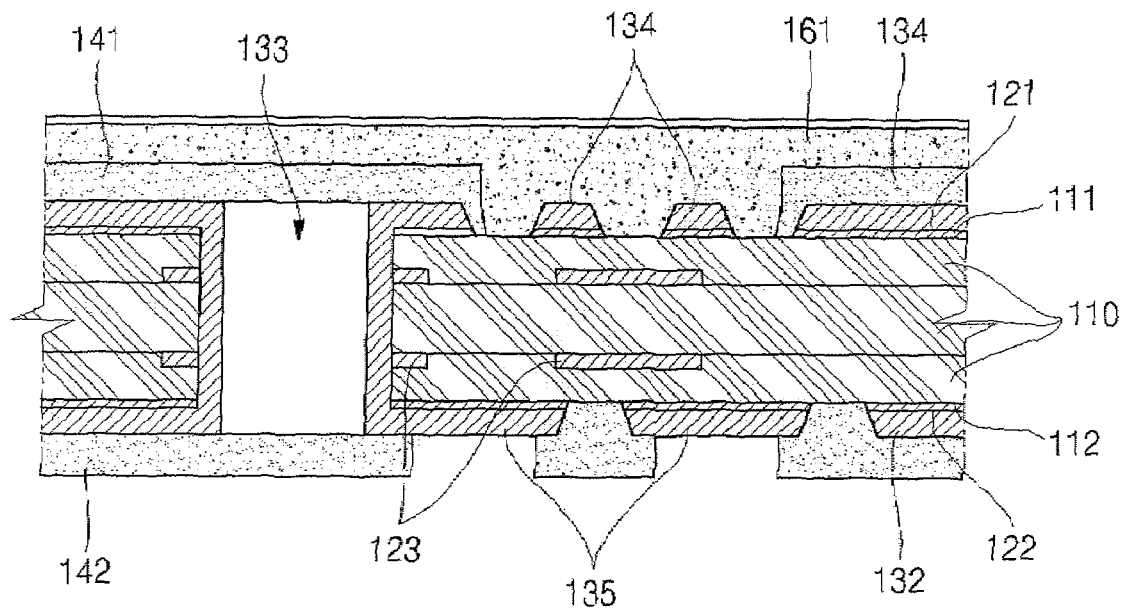
Figure 1I:
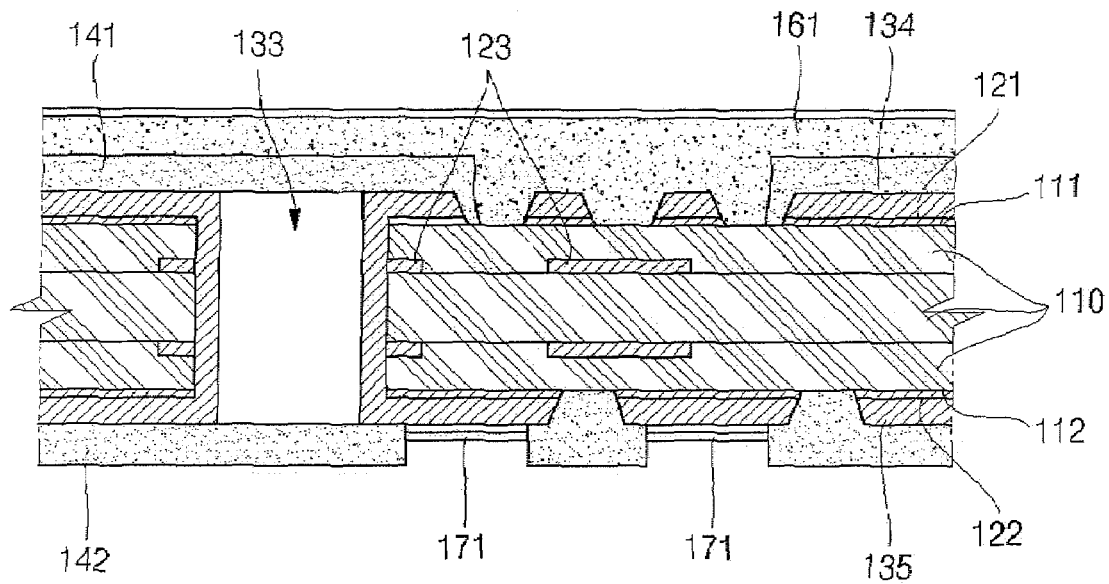
Figure 1J:
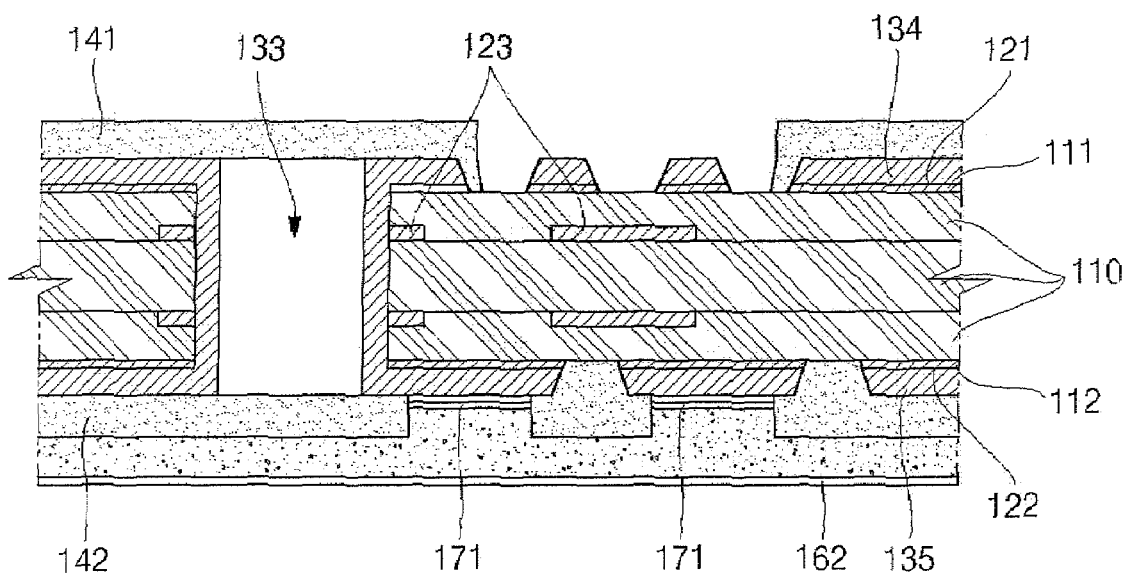
Figure 1K:
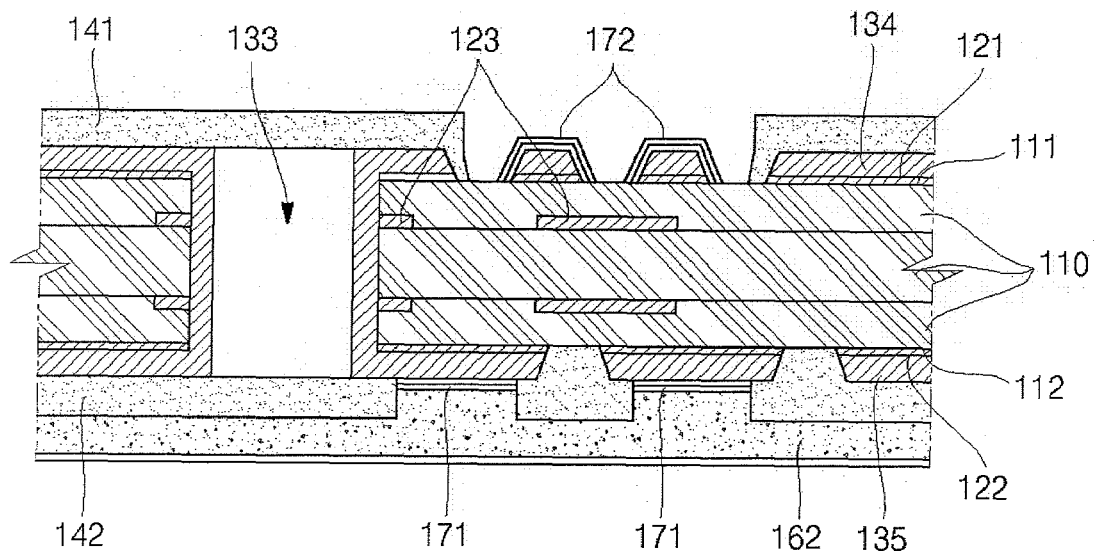
Figure 1L:
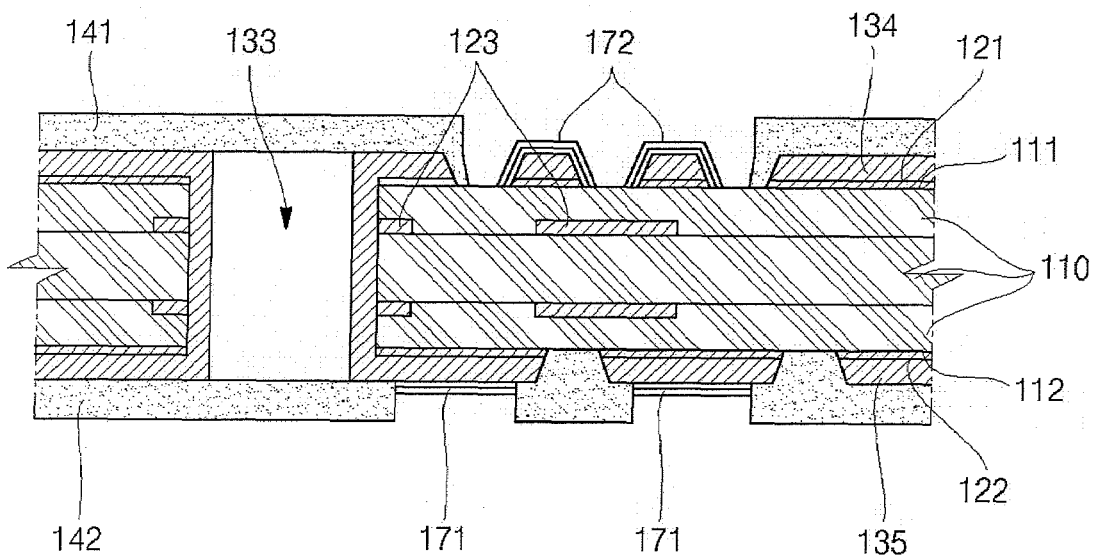

As shown, the method for manufacturing a semiconductor device substrate according to an embodiment of the present invention generally includes a patterning step (refer to FIGS. 1A, 1B, 1C, and 1D), a solder mask formation step (refer to FIGS. 1E, 1F, and 1G), a first conductive film attachment step (refer to FIG. 1H), a first plating formation step (refer to FIG. 1I), a second conductive film attachment step (refer to FIG. 1J), and a second plating formation step (refer to FIGS. 1K and 1L).

Particularly, the patterning step includes a hole formation step (refer to FIG. 1A), a basic plating formation step (refer to FIG. 1B), and an etching step (refer to FIGS. 1C and 1D).

As shown in FIG. 1A, in the hole formation step, a hole 113 is formed on an insulation layer 110, which has relatively thin copper foil 121 and 122 formed on first and second surfaces 111 and 112 thereof. For example, a laser or drill is used to form a hole 113 with a predetermined diameter in such a manner that the hole 113 completely extends through the first and second surfaces 111 and 112 of the insulation layer 110, as well as the copper foil 121 and 122 formed on the first and second surfaces 111 and 112. The insulation layer 110 may have a multilayered structure with a number of circuit patterns 123 formed between respective layers.

As shown in FIG. 1B, in the basic plating formation step, basic platings 131 and 132 are formed on the copper foil 121 and the hole 113 with a predetermined thickness. As a result, the hole 113 becomes a conductive via-hole 133 and connects the basic platings 131 and 132, which are formed on the first and second surfaces 111 and 112, to each other.

As shown in FIG. 1C, in the etching step, the basic platings are etched with a predetermined chemical solution so that circuit patterns 134 and 135 are formed on the first and second surfaces 111 and 112 of the insulation layer 110, respectively, in a predetermined shape. The circuit patterns 134 and 135 on the first and second surfaces 111 and 112 are connected to each other via the conductive via-hole 133. The etching step may include photosensitive dry film attachment, exposure, development, etching, and stripping steps.

As a result of the etching step, as shown in FIG. 1D, a number of circuit patterns 134 are formed on the first surface 111 of the insulation layer 110. It is to be noted that, contrary to the prior art, the circuit patterns 134 have no lead-in line formed so as to extend to the edge of the insulation layer 110. In addition, the circuit patterns 134, formed on the same surface, are electrically independent of one another. In the drawing, reference numeral 133 refers to the conductive via-hole.

The solder mask formation step includes a solder mask printing step (refer to FIG. 1E), an exposure step (refer to FIG. 1F), and a development step (refer to FIG. 1G). As shown in FIG. 1E, in the solder mask printing step, solder masks 141 and 142 are printed on the first and second surfaces 111 and 112 of the insulation layer 110, respectively, with a predetermined amount. As a result, the circuit patterns 134 and 135, which have been formed on the first and second surfaces 111 and 112, respectively, are completely covered with the solder masks 141 and 142.

As shown in FIG. 1F, in the exposure step, masks 151 and 153, which have predetermined patterns 152 and 154 formed thereon, are brought into contact with the respective solder masks 141 and 142, and predetermined light is radiated to the masks 151 and 153 to expose predetermined regions of the solder masks 141 and 142 to light.

As shown in FIG. 1G, in the development step, a predetermined development solution is sprayed to the exposed solder masks 141 and 142 to remove regions of the solder masks 141 and 142, which haven't been exposed to light. In this manner, predetermined regions of the circuit patterns 134 and 135, which have been formed on the first and second surfaces 111 and 112 of the insulation layer 110, are exposed to the outside of the solder masks 141 and 142.

As shown in FIG. 1H, in the first conductive film attachment step, first conductive film 161 is attached to the first surface 111 of the insulation layer 110. As a result, regions of the circuit patterns 134 formed on the first surface 111, which are exposed to the outside of the solder mask 141, are connected to the first conductive film 161. Since all circuit patterns 134 on the first surface 111 are connected to the circuit patterns 135 on the second surface 112 via the conductive via-hole 133, all circuit patterns 135 are connected to the first conductive film 161 accordingly. The first conductive film 161 may be anisotropic conductive film or an equivalent thereof, but the type is not limited to that herein.

As shown in FIG. 1I, in the first plating formation step, a first plating 171 is formed in predetermined regions of the circuit patterns 135, which have been formed on the second surface 112 of the insulation layer 110 and exposed to the outside via the solder mask 142, with a predetermined thickness. Since all circuit patterns 135 on the second surface 112 are connected to the circuit patterns 134 on the first surface 111 and to the first conductive film 161 via the conductive via-hole 133, the circuit patterns 135 can be electroplated. Particularly, a direct current is applied while using the first conductive film 161 as a cathode and the plating solution as an anode, so that metal in the plating solution is reduced by an electrochemical reaction, and a first plating 171 is formed in regions of the circuit patterns 135, which have been formed on the second surface 112 of the insulation layer 110 and exposed to the outside via the solder mask 142, with a predetermined thickness. In this manner, the first plating 171 is formed with a sufficient thickness in an electroplating method. The first plating 171 can be formed by electrodepositing nickel (Ni) and gold (Au) successively. The nickel attaches gold to the circuit patterns 135, and the gold prevents oxidation so that wire bonding and solder ball bonding can be performed later.

As shown in FIG. 1J, in the second conductive film attachment step, second conductive film 162 is attached to the second surface 112 of the insulation layer 110. As a result, all regions of the circuit patterns 135, which have been formed on the second surface 112 of the insulation layer 110 and exposed to the outside of the solder mask 142, i.e. first plating 171, are connected to the second conductive film 162. Since all circuit patterns 135 on the second surface 112 are connected to the circuit patterns 134 on the first surface 111 via the conductive via-hole 133, all circuit patterns 134 on the first surface 111 are connected to the second conductive film 162 accordingly. The second conductive film 162 may be anisotropic conductive film or an equivalent thereof, but the type is not limited to that herein. Obviously, the first conductive film 161 is removed before the second conductive film attachment step.

As shown in FIG. 1K, in the second plating formation step, a second plating 172 is formed in predetermined regions of the circuit patterns 134, which have been formed on the first surface 111 of the insulation layer 110 and exposed to the outside via the solder mask 141, with a predetermined thickness. Since all circuit patterns 134 on the first surface 111 are connected to the circuit patterns 135 on the second surface 112 and to the second conductive film 162 via the conductive via-hole 133, the circuit patterns 134 can be electroplated. Particularly, a direct current is applied while using the second conductive film 162 as a cathode and the plating solution as an anode, so that metal in the plating solution is reduced by an electrochemical reaction, and a second plating 172 is formed in regions of the circuit patterns 134, which have been formed on the first surface 111 of the insulation layer 110 and exposed to the outside via the solder mask 141, with a predetermined thickness. In this manner, the second plating 172 is formed with a sufficient thickness in an electroplating method. The second plating 172 can be formed by electrodepositing nickel and gold successively. The nickel attaches gold to the circuit patterns 134, and the gold prevents oxidation so that wire bonding and solder ball bonding can be performed later.

Finally, as shown in FIG. 1L, the second conductive film is removed to complete a semiconductor device substrate 100 according to the present invention.

The method for manufacturing a semiconductor device substrate 100 according to the present invention is advantageous in that, since no bus line and lead-in line are necessary, contrary to the prior art, the density of circuit patterns increases and the degree of freedom in designing the circuit patterns improves. In addition, absence of lead-in line on the substrate avoids reflection and delay of electrical signals flowing through the circuit patterns. This improves the electrical performance of the substrate. Since no lead-in line and circuit pattern are exposed to the outer periphery of the substrate, no static electricity flows into the semiconductor device and no short circuit occurs while manufacturing or handling the semiconductor device.

In addition, dry film attachment, exposure, and development steps, which have been repeated a number of times in the prior art, can be omitted in the inventive method for manufacturing a substrate. This reduces the manufacturing cost, simplifies the manufacturing process, and substantially reduces the defective ratio.

Referring to FIGS. 2A to 2K, a series of steps of a method for manufacturing a semiconductor device substrate according to another embodiment of the present invention is illustrated.

As shown, the method for manufacturing a semiconductor device substrate according to another embodiment of the present invention generally includes a patterning step (refer to FIGS. 2A, 2B, 2C, and 2D), a conductive film attachment step (refer to FIGS. 2E and 2F), a plating formation step (refer to FIG. 2G), and a solder mask formation step (refer to FIGS. 2H, 2I, 2J, and 2K). The patterning step includes a hole formation step (refer to FIG. 2A), a basic plating formation step (refer to FIG. 2B), and an etching step (refer to FIGS. 2C and 2D).

Figure 2A:
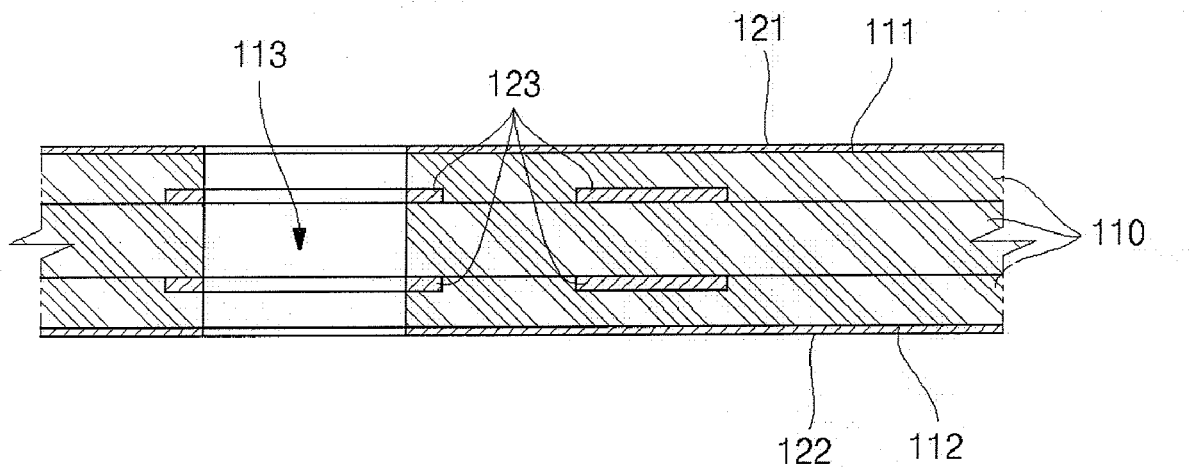
FIGS. 2A to 2K show a series of steps of a method for manufacturing a semiconductor device substrate according to another embodiment of the present invention, particularly.

As shown in FIG. 2A, in the hole formation step, a hole 113 is formed on an insulation layer 110, which has relatively thin metallic foil 121 and 122 formed on first and second surfaces 111 and 112 thereof. For example, a laser or drill is used to form a hole 113 with a predetermined diameter in such a manner that the hole 113 completely extends through the first and second surfaces 111 and 112 of the insulation layer 110, as well as the metallic foil 121 and 122 formed on the first and second surfaces 111 and 112. The insulation layer 110 may have multilayered structure with a number of circuit patterns 123 formed between respective layers.

Figure 2B:
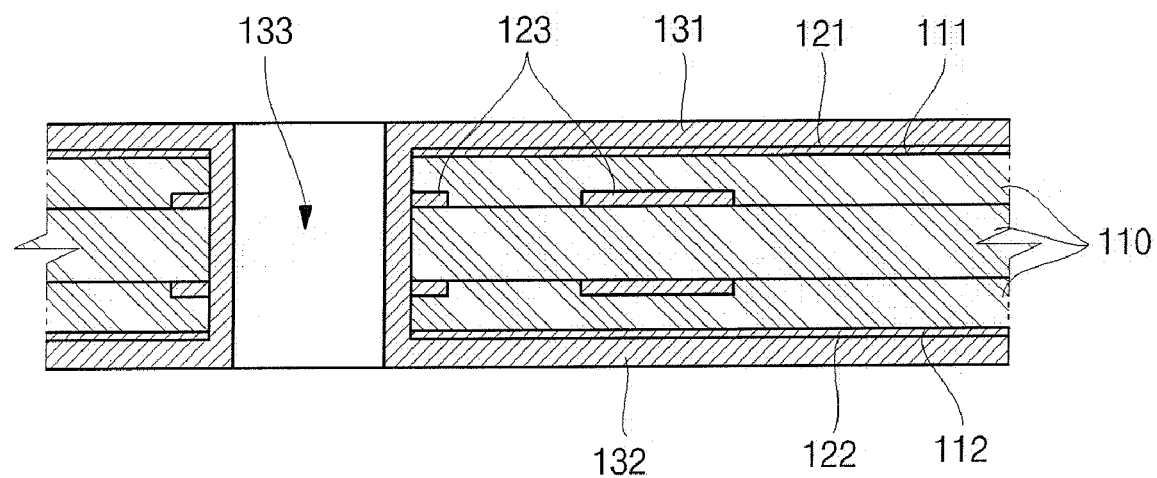

As shown in FIG. 2B, in the basic plating formation step, basic platings 131 and 132 are formed on the metallic foil 121 and the hole 113 with a predetermined thickness. As a result, the hole 113 becomes a conductive via-hole 133 and connects the basic platings 131 and 132, which are formed on the first and second surfaces 111 and 112, to each other.

Figure 2C:
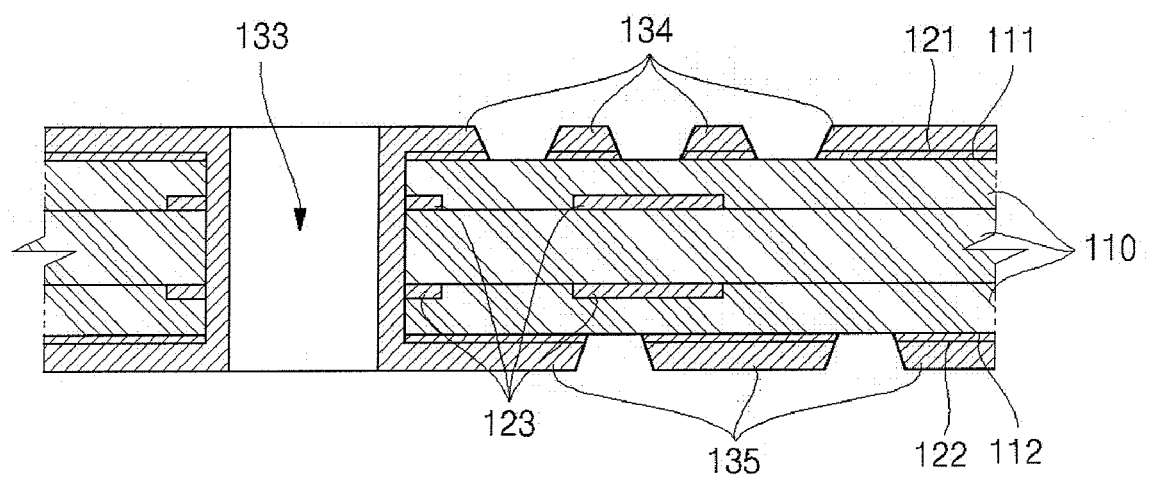

As shown in FIG. 2C, in the etching step, the basic platings 131 and 132 are etched with a predetermined chemical solution so that circuit patterns 134 and 135 are formed on the first and second surfaces 111 and 112 of the insulation layer 110, respectively, in a predetermined shape. Obviously, the circuit patterns 134 and 135 on the first and second surfaces 111 and 112 are connected to each other via the conductive via-hole 133. The etching step may be subdivided into photosensitive dry film attachment, exposure, development, etching, and stripping steps.

Figure 2D:
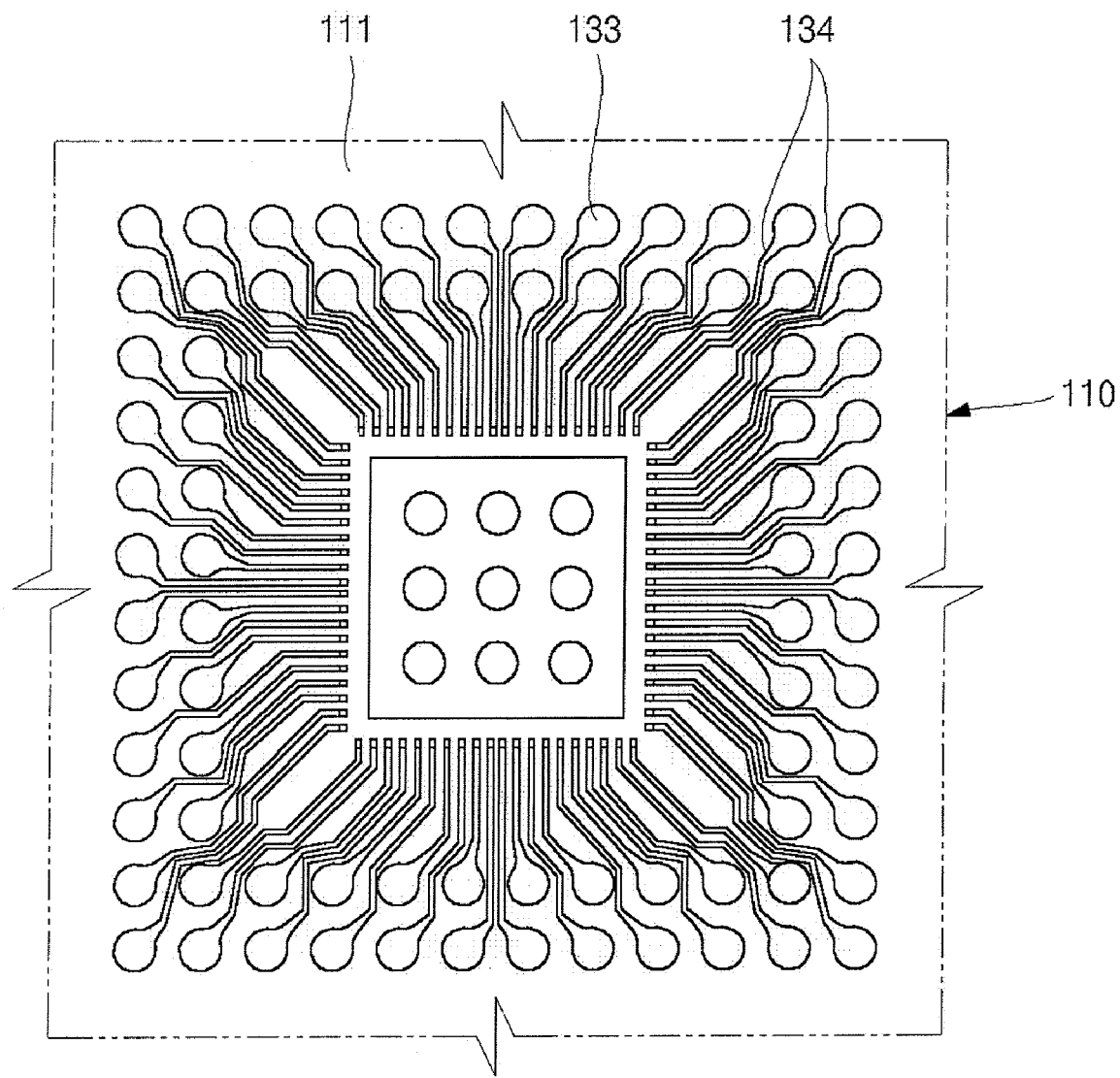

As a result of the etching step, as shown in FIG. 2D, a number of circuit patterns 134 are formed on the first surface 111 of the insulation layer 110. It is to be noted that, contrary to the prior art, the circuit patterns 134 have no lead-in line formed thereon, which extends to the edge of the insulation layer 110. In addition, the circuit patterns 134, formed on the same surface, are electrically independent of one another. In the drawing, reference numeral 133 refers to the conductive via-hole.

Figure 2E:
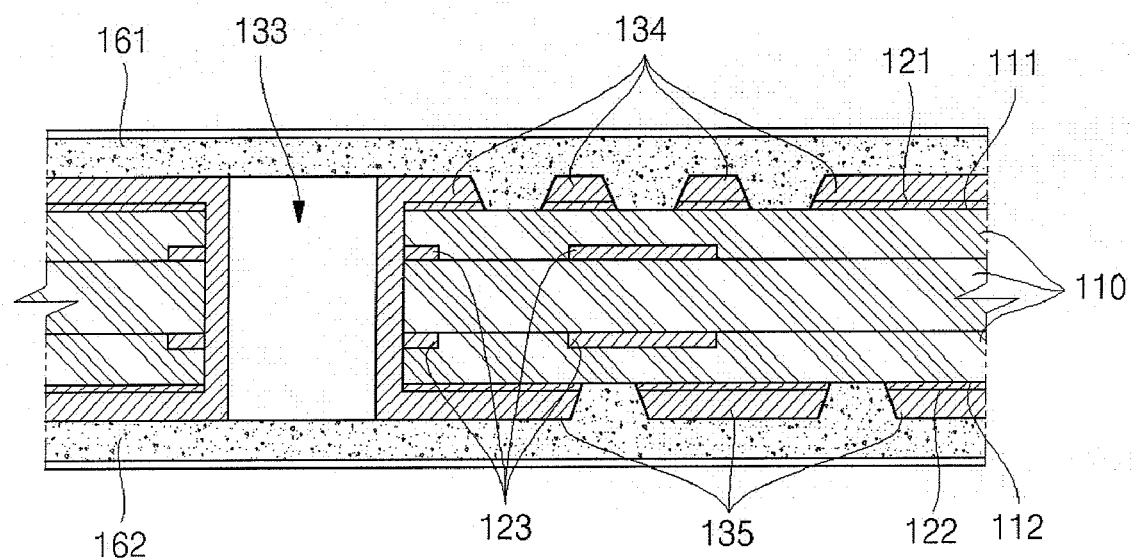
Figure 2F:
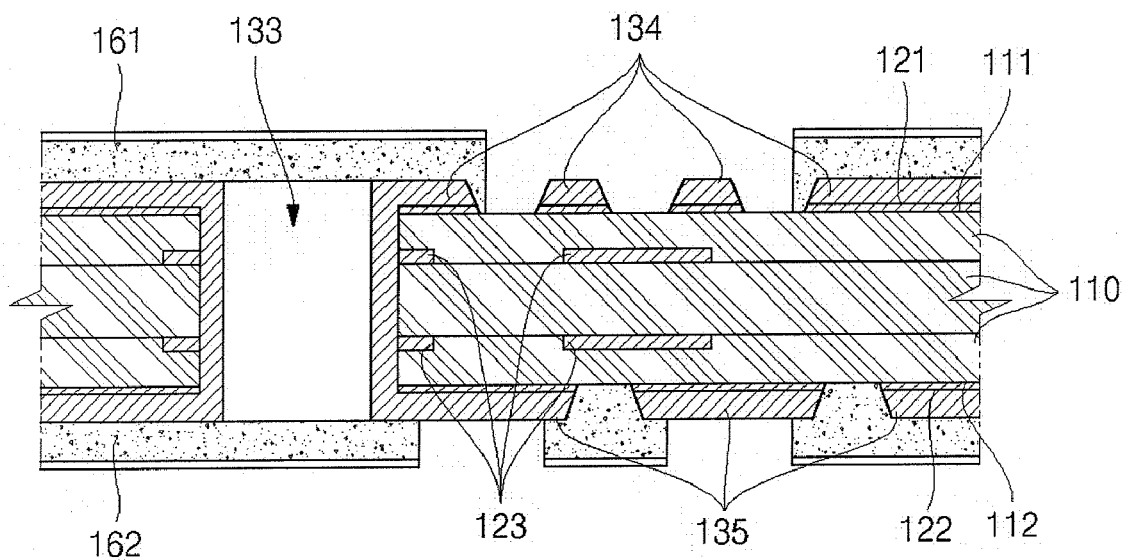

The conductive film attachment step includes a conductive film attachment step (refer to FIG. 2E) and a conductive film development step (refer to FIG. 2F). As shown in FIG. 2E, in the conductive film attachment step, conductive film 161 and 162 are attached to the circuit patterns 134 and 135, which have been formed on the first and second surfaces 111 and 112 of the insulation layer 110 and exposed to the outside, respectively. As a result, all circuit patterns 134 on the first surface 111 of the insulation layer 110 are connected to the conductive film 161, and all circuit patterns 135 on the second surface 112 thereof are connected to the conductive film 162. As the conductive film 161 and 162, photosensitive conductive film is used to enable an optional phenomenon, as will be described later. The conductive film 161 and 162 may also be photosensitive anisotropic conductive film. As shown in FIG. 2F, in the conductive film development step, the conductive film 161 and 162 on the first and second surfaces 111 and 112 of the insulation layer 110, respectively, are subjected to exposure/development processes, in order to remove predetermined regions of the conductive film 161 and 162. As a result, predetermined regions of the circuit patterns 134 on the first surface 111 of the insulation layer 110 are exposed to the outside via the conductive film 161, and predetermined regions of the circuit patterns 135 on the second surface 112 thereof are exposed to the outside via the conductive film 162.

Figure 2G:
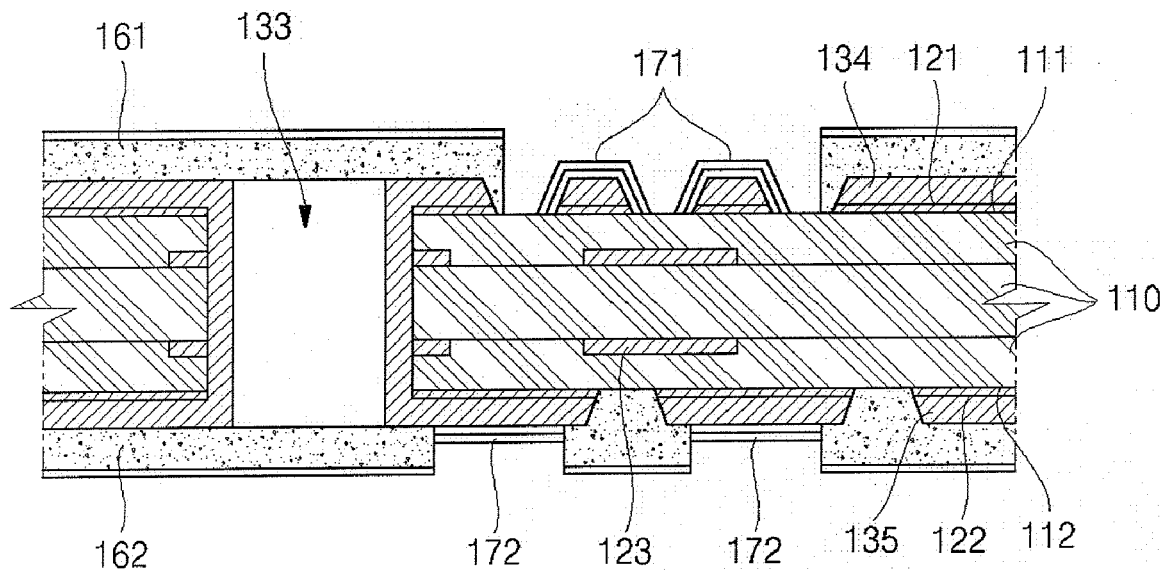
Figure 2H:
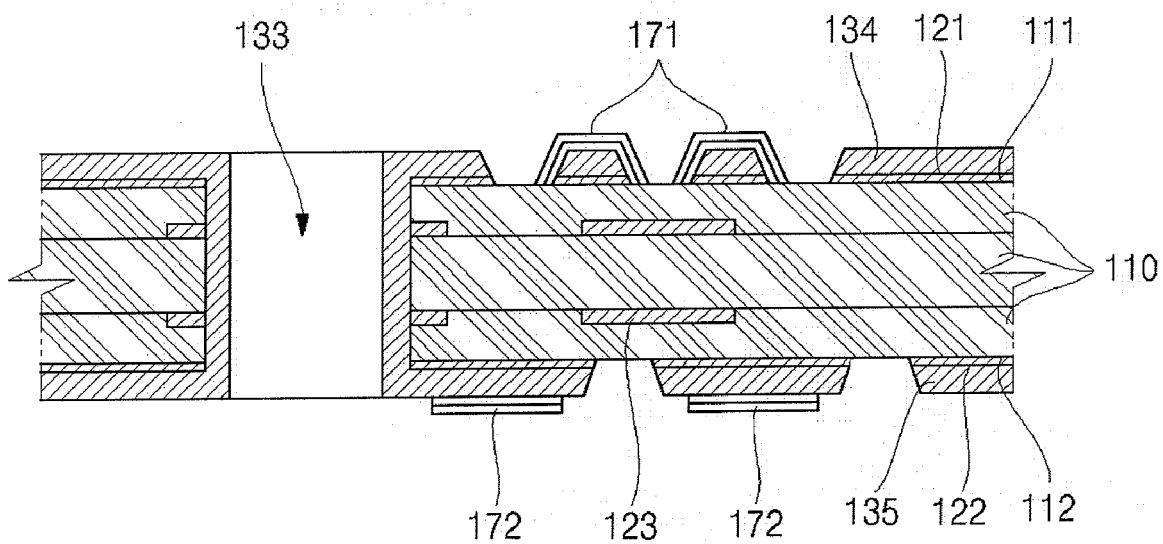

As shown in FIG. 2G, in the plating formation step, first and second platings 171 and 172 are formed in predetermined regions of the circuit patterns 134 and 135 on the first and second surfaces 111 and 112 of the insulation layer 110, respectively, with a predetermined thickness. Particularly, a first plating 171 is formed in predetermined regions of the circuit patterns 134, which have been formed on the first surface 111 of the insulation layer 110 and exposed via the conductive film 161, and a second plating 172 is formed in predetermined regions of the circuit patterns 135, which have been formed on the second surface 112 of the insulation layer 110 and exposed via the conductive film 162. A direct current is applied while using the first and second conductive film 161 and 162, which have been attached to the first and second surfaces 111 and 112 of the insulation layer 110, respectively, as a cathode and the plating solution as an anode, so that metal in the plating solution is reduced by an electrochemical reaction. As a result, a first plating 171 is formed in regions of the circuit patterns 134, which have been formed on the first surface 111 of the insulation layer 110 and exposed to the outside via the conductive film 161, and a second plating 172 is formed in regions of the circuit patterns 135, which have been formed on the second surface 112 of the insulation layer 110 and exposed to the outside via the conductive film 162. In this manner, the first and second platings 171 and 172 are formed with a sufficient thickness in an electroplating method. The first and second platings 171 and 172 can be formed by electrodepositing nickel (Ni) and gold (Au) successively. The nickel attaches gold to the circuit patterns 134 and 135, and the gold prevents oxidation so that wire bonding and solder ball bonding can be performed later.

Figure 2I:
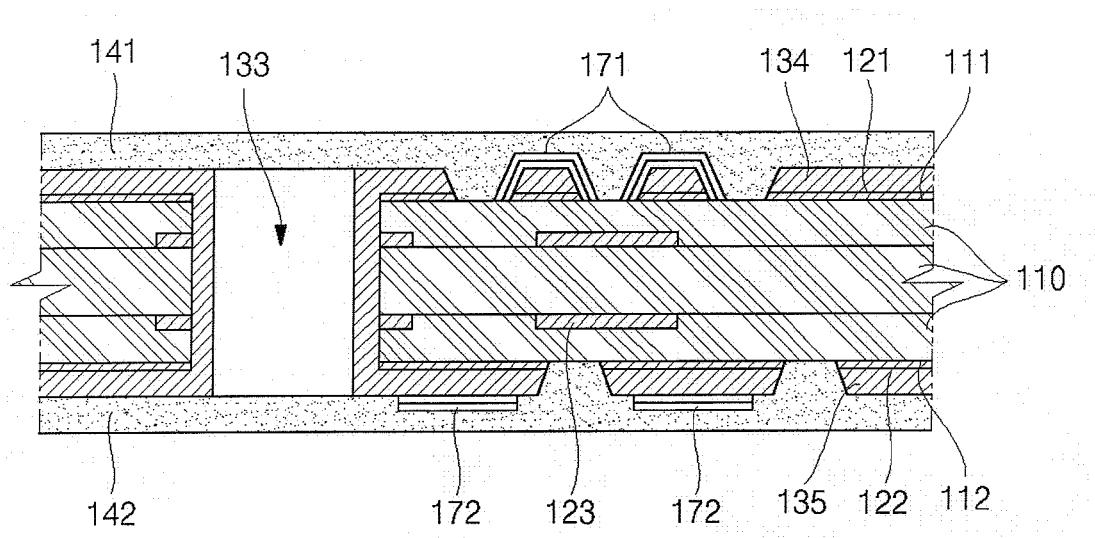
Figure 2J:
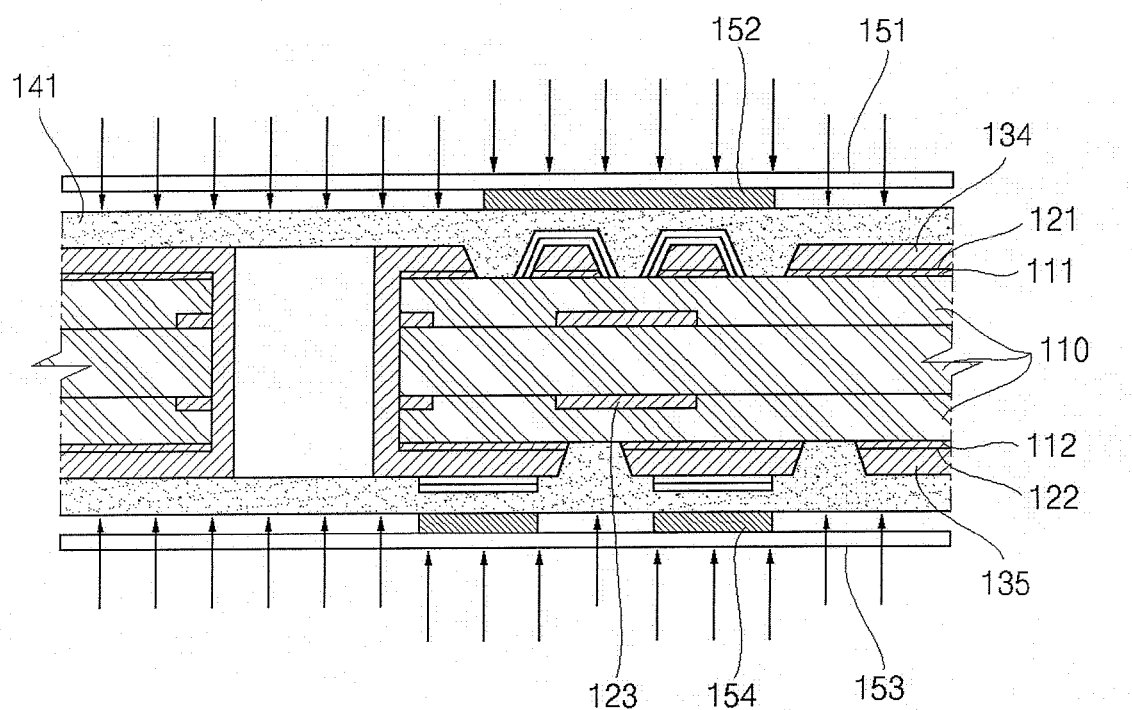
Figure 2K:
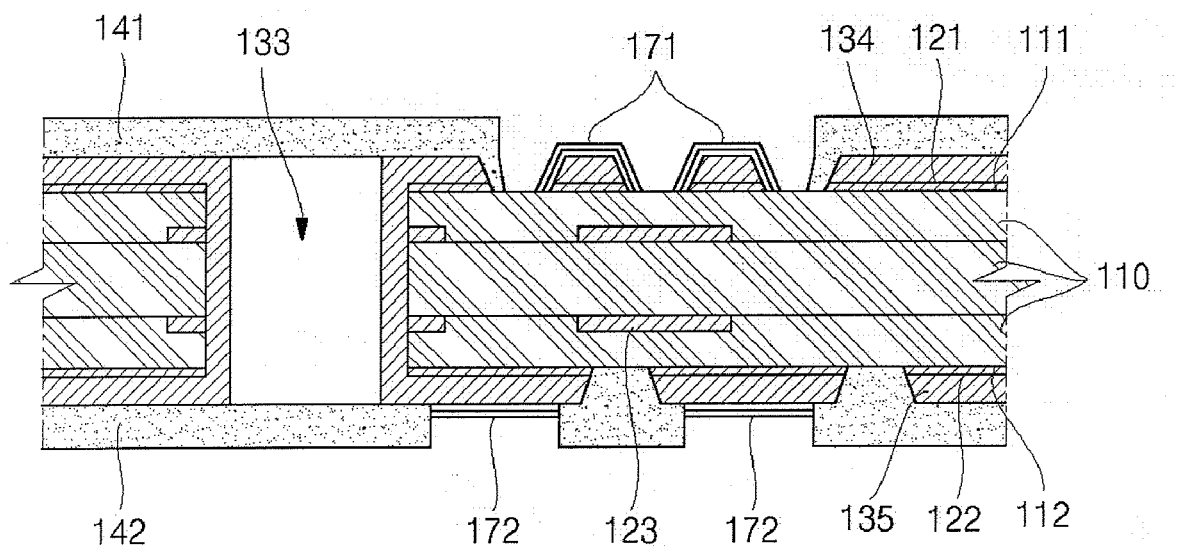

The solder mask formation step includes a solder mask printing step (refer to FIG. 2I), an exposure step (refer to FIG. 2J), and a development step (refer to FIG. 2K).

As shown in FIG. 2I, in the solder mask printing step, solder masks 141 and 142 are printed on the first and second surfaces 111 and 112 of the insulation layer 110, respectively, with a predetermined amount. As a result, the circuit patterns 134 and 135, which have been formed on the first and second surfaces 111 and 112, respectively, and the first and second platings 171 and 172 are completely covered with the solder masks 141 and 142.

As shown in FIG. 2J, in the exposure step, masks 151 and 153, which have predetermined patterns 152 and 154 formed thereon, are brought into contact with the respective solder masks 141 and 142, and predetermined light is radiated to the masks 151 and 153 to expose predetermined regions of the solder masks 141 and 142 to light.

As shown in FIG. 2K, in the development step, a predetermined development solution is sprayed to the exposed solder masks 141 and 142 to remove regions of the solder masks 141 and 142, which have not been exposed to light. In this manner, the first and second platings 171 and 172, which have been formed on the first and second surfaces 111 and 112 of the insulation layer 110, are exposed to the outside of the solder masks 141 and 142. This completes a substrate 100 according to the present invention.

The method for manufacturing a substrate according to another embodiment of the present invention is advantageous in that, even when the circuit patterns 134 and 135 respectively formed on the first and second surfaces 111 and 112 of the insulation layer 110 are not connected to each other via the conductive via-hole 133, first and second platings 171 and 172 can be completely formed on the respective circuit patterns 134 and 135. This is because electroplating is simultaneously performed while conductive film 161 and 162 are attached to the circuit patterns 134 and 135, which have been formed on the first and second surfaces 111 and 112 of the insulation layer 110, respectively. As a result, circuit patterns can be designed more variously.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A method for manufacturing a semiconductor device substrate comprising:
   providing an insulation layer;
   forming circuit patterns on first and second surfaces of the insulation layer;
   forming a solder mask on the first and second surfaces while exposing predetermined regions of the circuit patterns to an outside;
   coupling a first conductive film to the first surface to electrically couple the circuit patterns formed on the first and second surfaces;
   forming a first plating on the circuit patterns formed on the second surface and exposed to the outside;
   removing the first conductive film;
   coupling a second conductive film to the second surface to electrically connect all circuit patterns formed on the first and second surfaces; and
   forming a second plating on the circuit patterns formed on the first surface and exposed to the outside.

2. The method of claim 1, further comprising removing the second conductive film after forming a second plating on the circuit patterns formed on the first surface.

3. The method of claim 1, wherein the insulation layer has a conductive via-hole which extends through the first and second surfaces, the circuit patterns on the first surface are electrically connected to the circuit patterns on the second surface via the conductive via-hole.

4. The method of claim 1, wherein the first conductive film is anisotropic conductive film.

5. The method of claim 1, wherein coupling the first conductive film to the first surface further comprises coupling the first conductive film to the solder mask formed on the first surface of the insulation layer and to surfaces of the circuit patterns exposed to the outside via the solder mask.

6. The method of claim 1, wherein, in the first plating formation step, the second surface is formed in an electroplating method, and the circuit patterns exposed to the outside are successively plated with nickel and gold.

7. The method of claim 1, wherein the second conductive film is anisotropic conductive film.

8. The method of claim 1, wherein coupling a second conductive film to the second surface further comprises coupling the second conductive film to the solder mask formed on the second surface of the insulation layer and to surfaces of the circuit patterns exposed to the outside via the solder mask.

9. The method of claim 1, wherein, forming a second plating further comprises forming the first surface by electroplating, the circuit patterns exposed to the outside plated with nickel and gold.

10. A method for manufacturing a semiconductor device substrate comprising:

forming circuit patterns on first and second surfaces of an insulation layer;

attaching a conductive film to the first and second surfaces of the insulation layer;

exposing predetermined regions of the circuit patterns formed on the first and second surfaces;

forming a plating on the circuit patterns on the first and second surfaces exposed;

forming a solder mask on each of the first and second surfaces of the insulation layer with a predetermined thickness; and exposing the plating formed on each of the first and second surfaces.

11. The method of claim 10, wherein the insulation layer has a conductive via-hole formed and extends through the first and second surfaces, the circuit patterns on the first surface are electrically connected to the circuit patterns on the second surface via the conductive via-hole.

12. The method of claim 10, wherein the conductive film is anisotropic conductive film.

13. The method of claim 10, wherein the conductive film is photosensitive.

14. The method of claim 10, wherein attaching the conductive film further comprises attaching the conductive film to surfaces of the circuit patterns formed on the first surface of the insulation layer and to the circuit patterns formed on the second surface of the insulation layer.

15. The method of claim 10, wherein forming the plating further comprises electroplating the first and second surfaces.

16. The method of claim 15, wherein the circuit patterns exposed to the outside are plated with nickel and gold.

17. A method for manufacturing a semiconductor device substrate comprising:

providing an insulation layer;

forming conductive via-hole through the first and second surfaces, the circuit patterns on the first surface electrically coupled to the circuit patterns on the second surface via the conductive via-hole;

forming circuit patterns on first and second surfaces of an insulation layer;

attaching a conductive film to the first and second surfaces of the insulation layer;

exposing predetermined regions of the circuit patterns formed on the first and second surfaces;

forming a plating on the circuit patterns on the first and second surfaces exposed;

forming a solder mask on each of the first and second surfaces of the insulation layer with a predetermined thickness; and exposing the plating formed on each of the first and second surfaces.

18. The method of claim 17, wherein the conductive film is anisotropic conductive film.

19. The method of claim 17, wherein the conductive film is photosensitive.

20. The method of claim 17, wherein forming the plating further comprises electroplating the first and second surfaces.

* * * * *